(12) United States Patent
Liu

(10) Patent No.: US 10,157,977 B2
(45) Date of Patent: Dec. 18, 2018

(54) SEMICONDUCTOR DEVICE

(71) Applicant: TAIWAN SEMICONDUCTOR MANUFACTURING COMPANY LTD., Hsinchu (TW)

(72) Inventor: Ming Chyi Liu, Hsinchu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 15/679,675

(22) Filed: Aug. 17, 2017

(65) Prior Publication Data

US 2017/0345885 A1 Nov. 30, 2017

Related U.S. Application Data

(62) Division of application No. 15/073,013, filed on Mar. 17, 2016, now Pat. No. 9,768,244.

(51) Int. Cl.
*H01L 49/02* (2006.01)
(52) U.S. Cl.
CPC ................... *H01L 28/60* (2013.01)
(58) Field of Classification Search
CPC ............ H01L 27/0676; H01L 27/0716; H01L 27/0755; H01L 27/0777; H01L 27/0788; H01L 27/0794; H01L 27/0805; H01L 28/60
See application file for complete search history.

(56) References Cited

U.S. PATENT DOCUMENTS

| | | | |
|---|---|---|---|
| 5,216,572 A * | 6/1993 | Larson | H01L 27/11502 257/295 |
| 8,796,666 B1 | 8/2014 | Huang et al. | |
| 9,012,132 B2 | 4/2015 | Chang | |
| 9,028,915 B2 | 5/2015 | Chang et al. | |
| 9,093,530 B2 | 7/2015 | Huang et al. | |
| 9,146,469 B2 | 9/2015 | Liu et al. | |
| 9,213,234 B2 | 12/2015 | Chang | |
| 9,223,220 B2 | 12/2015 | Chang | |
| 9,256,133 B2 | 2/2016 | Chang | |
| 9,536,759 B2 | 1/2017 | Yang et al. | |
| 9,548,303 B2 | 1/2017 | Lee et al. | |
| 2003/0213989 A1 * | 11/2003 | Delpech | H01L 23/5223 257/301 |
| 2007/0246762 A1 * | 10/2007 | Amo | G11C 15/043 257/296 |
| 2013/0161792 A1 * | 6/2013 | Tran | H01L 29/92 257/534 |
| 2013/0181326 A1 * | 7/2013 | Cheng | H01L 21/32134 257/534 |

* cited by examiner

*Primary Examiner* — Yosef Gebreyesus
(74) *Attorney, Agent, or Firm* — WPAT, P.C., Intellectual Property Attorneys; Anthony King

(57) ABSTRACT

A semiconductor device includes a first electrode layer and a second electrode layer. The first electrode layer extends in a first direction. The second electrode layer extends in the first direction for a different length from the first electrode layer, and is symmetric with respect to a center line of the first electrode layer in a second direction. The second electrode layer defines a capacitor with the first electrode layer.

20 Claims, 18 Drawing Sheets

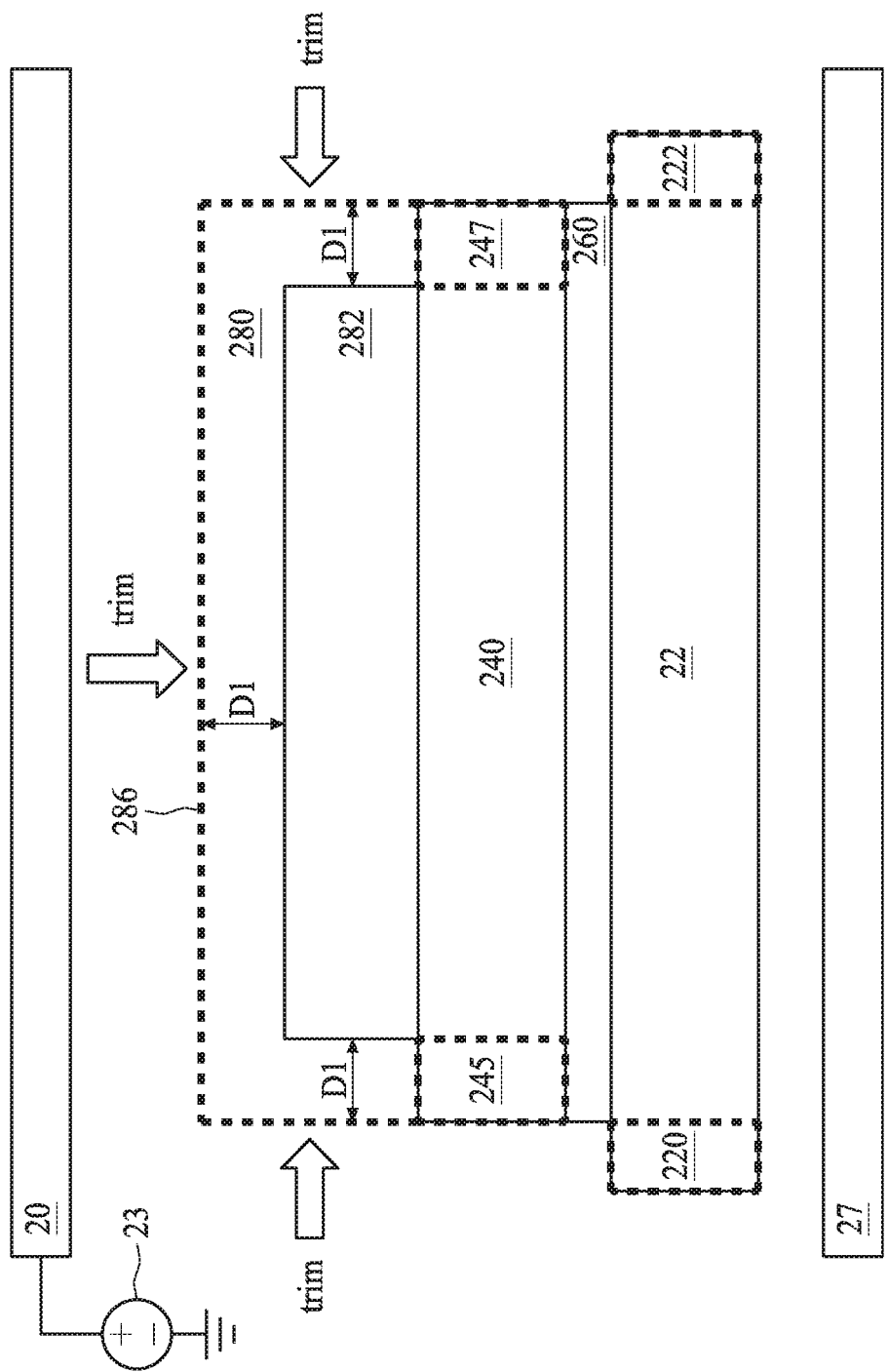

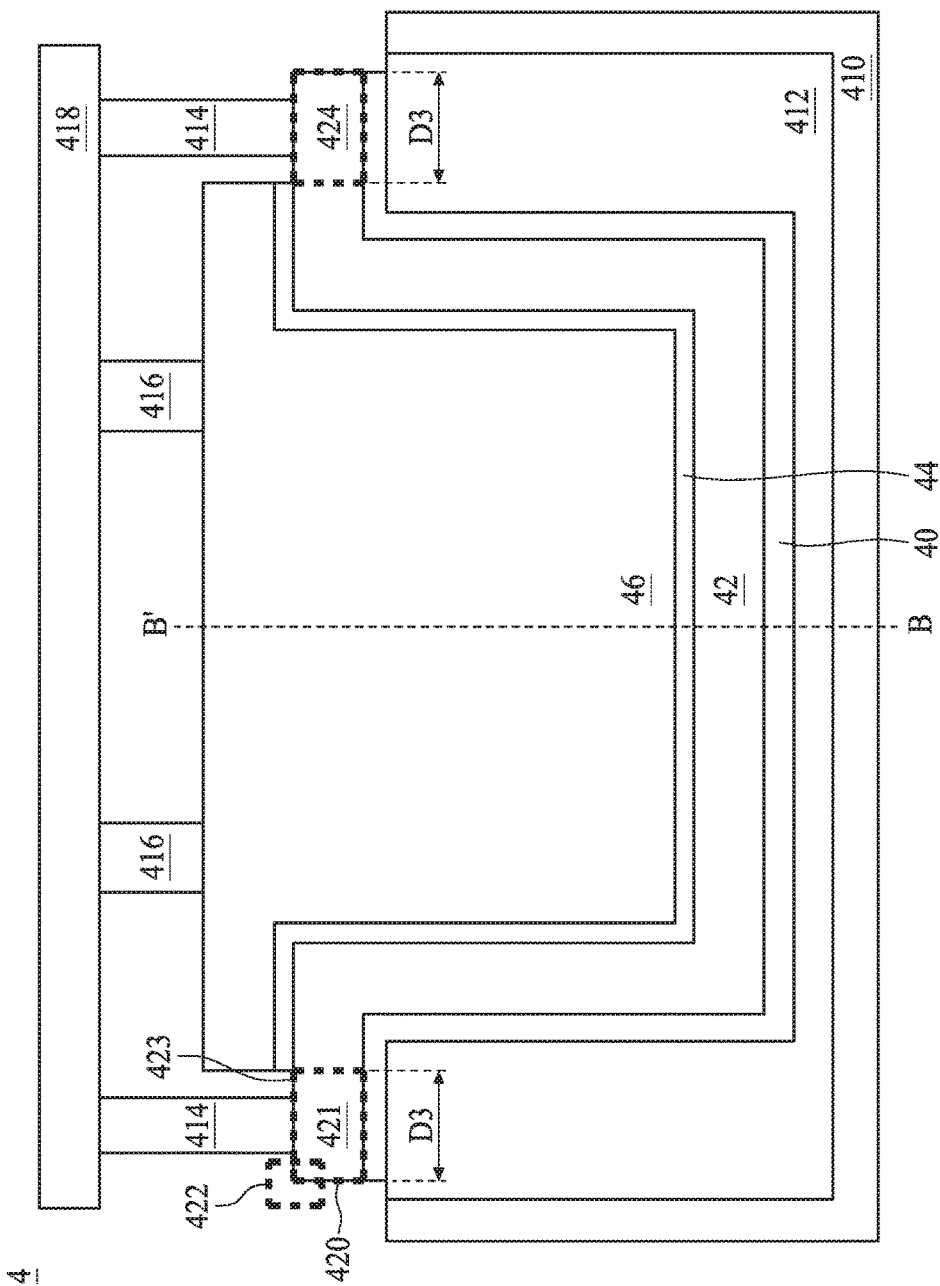

SEMICONDUCTOR DEVICE

CROSS-REFERENCE TO RELATED APPLICATIONS

This application is a divisional of U.S. application Ser. No. 15/073,013, filed Mar. 17, 2016.

BACKGROUND

Generally, a deep trench capacitor (DTC) may be used as a replacement for a ceramic capacitor in a printed circuit board (PCB). However, a traditional DTC requires an additional landing area for a contact landing to a substrate.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2A to 2J are diagrams showing a method of manufacturing the semiconductor device shown in FIG. 1A, in accordance with some embodiments of the present disclosure.

FIG. 4 is a cross-sectional view of a semiconductor device, in accordance with some embodiments of the present disclosure.

DETAILED DESCRIPTION

Figure 1A:
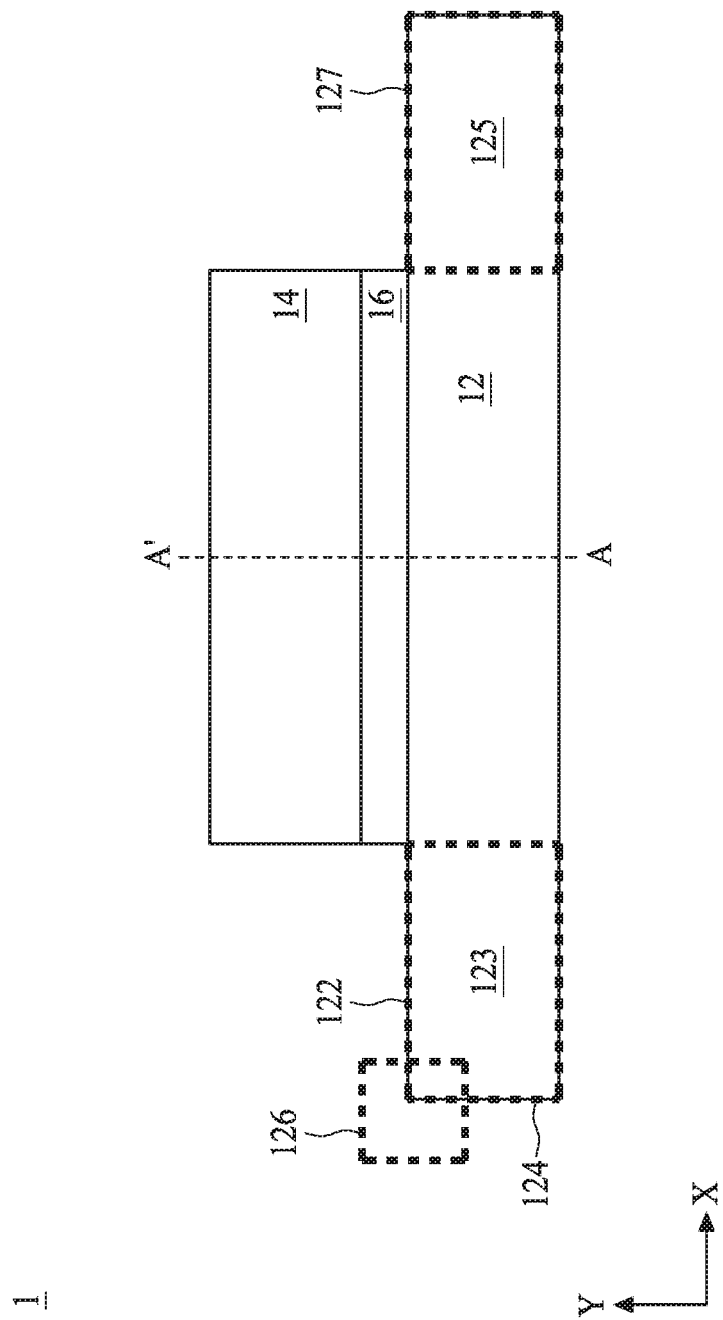
FIG. 1A is a cross-sectional view of a semiconductor device having a symmetric structure, in accordance with some embodiments of the present disclosure.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

FIG. 1A is a cross-sectional view of a semiconductor device 1 having a symmetric structure, in accordance with some embodiments of the present disclosure. Referring to FIG. 1A, the semiconductor device 1 includes a first electrode layer 12, a dielectric layer 16 and a second electrode layer 14. The first electrode layer 12, the dielectric layer 16 and the second electrode layer 14 together define (or form) a capacitor.

The first electrode layer 12 extends in a first direction X. In some embodiments, the first electrode layer 12 includes polycrystalline silicon (or polysilicon). Alternatively, the first electrode layer 12 may include doped polysilicon metal. Further, the first electrode layer 12 may include $Al_2O_3$, $HfO_2$, $ZrO_2$, Al, Cu, W, Ti, Ta, TiN, TaN, NiSi, CoSi, Mo, Pt, TaC, WN, $Mo_2N$, TiAlN, TaAlN, Nb, Ir, Os, Ru, other suitable conductive materials, or combinations thereof.

The dielectric layer 16 is disposed between the first electrode layer 12 and the second electrode layer 14, and extends in the first direction X for a length different from the first electrode layer 12. For clear of illustration, the thickness of the dielectric layer 16 is exaggerated. In fact, the dielectric layer 16 is very thin with respect to the first and second electrode layers 12 and 14. In addition, the dielectric layer 16 partially covers the first electrode layer 12. Moreover, the dielectric layer 16 is substantially symmetric with respect to a center line A-A' of the first electrode layer 12 in a second direction Y different from the first direction X. Generally, the center line A-A' crosses the center of the first electrode layer 12. In some embodiments, the first direction X is orthogonal to the second direction Y.

In an embodiment, the dielectric layer 16 includes doped silicon glass such as phosphorous silicon glass (PSG) or boron phosphorous silicon glass (BPSG). In some embodiments, the dielectric layer 16 includes silicon oxide, silicon nitride, silicon oxynitride, spin-on glass (SOG), fluorinated silica glass (FSG), carbon doped silicon oxide (e.g., SiCOH), BLACK DIAMOND® (Applied Materials of Santa Clara, Calif.), XEROGEL®, AEROGEL®, amorphous fluorinated carbon, Parylene, BCB (bis-benzocyclobutenes), FLARE®, SILK® (Dow Chemical, Midland, Mich.), polyimide, other proper porous polymeric materials, other suitable dielectric materials, and/or combinations thereof. In another embodiment, the dielectric layer 16 includes a high density plasma (HDP) dielectric material (e.g., HDP oxide) and/or a high aspect ratio process (HARP) dielectric material (e.g., HARP oxide). In further another embodiment, the dielectric layer 16 includes silicon oxide, silicon nitride, silicon oxynitride, other suitable materials, or combinations thereof. In some embodiments, the dielectric layer 16 includes SN, SiON, or OX.

The second electrode layer 14 is disposed on the dielectric layer 16, and extends in the first direction X for a length different from the first electrode layer 12, but substantially the same as the dielectric layer 14. In the present embodiment, the second electrode layer 14 is shorter than the first electrode layer 12. In that case, the second electrode layer 16 partially covers the first electrode layer 12, and exposes a terminal portion 123 and another terminal portion 125 of the first electrode layer 12.

The terminal portion 123 of the first electrode layer 12 includes a surface 122, a sidewall 124 and a corner 126 connecting the surface 122 with the sidewall 124. The surface 122 of the terminal portion 123, for example, serves as a land to allow an interconnect feature (not shown), such as contact, to place thereon. To allow and facilitate the placement, the length of the surface 122 of the terminal portion 123 in the first direction X is long enough to accommodate the interconnect feature. In some embodiments, the length ranges from approximately 10 angstrom to approximately 10,000 angstrom.

Likewise, due to symmetricity, the terminal portion 125 of the first electrode layer 12 includes a surface 127, a sidewall (not numbered) and a corner (not numbered) connecting the surface 127 with the sidewall. The function and spatial features of the terminal portion 125 are similar to those of the terminal portion 123 and therefor are not discussed.

Please note that it is not intended for the disclosure to be limited to the examples shown above. One skilled in the art can apply the principles of the present disclosure to other applications as well without departing from the scope of the disclosure. In different applications, the surface 122 of the terminal portion 123 can have different lengths.

Furthermore, the second electrode layer 14 is also substantially symmetric with respect to the center line A-A' of the first electrode layer 12. As a result, the terminal portions 123 and 125, exposed by the second electrode layer 14, are substantially the same in size. Accordingly, the surface 122 of the terminal portion 123 is substantially the same as the surface 127 of the terminal portion 125 in length.

In some embodiments, the second electrode layer 14 includes polycrystalline silicon (or polysilicon). Alternatively, the second electrode layer 14 may include doped polysilicon. Further, the second electrode layer 14 may include $Al_2O_3$, $HfO_2$, $ZrO_2$, Al, Cu, W, Ti, Ta, TiN, TaN, NiSi, CoSi, Mo, Pt, TaC, WN, $Mo_2N$, TiAlN, TaAlN, Nb, Ir, Os, Ru, other suitable conductive materials, or combinations thereof.

Figure 1B:
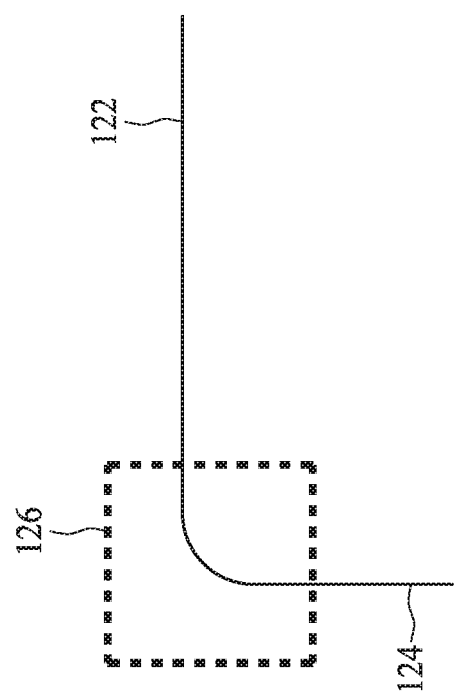
FIG. 1B is a zoom-in diagram for clearly showing the profile of the corner of the first electrode layer shown in FIG. 1A, in accordance with some embodiments of the present disclosure.

FIG. 1B is a zoom-in diagram for clearly showing the profile of the corner 126 of the first electrode layer 12 shown in FIG. 1A, in accordance with some embodiments of the present disclosure. Referring to FIG. 1B, the corner 126 has a rounded shape as a result of a manufacturing method according to embodiments of the present disclosure, which will be discussed in detail below with reference to FIGS. 2A to 2J.

Figure 2A:
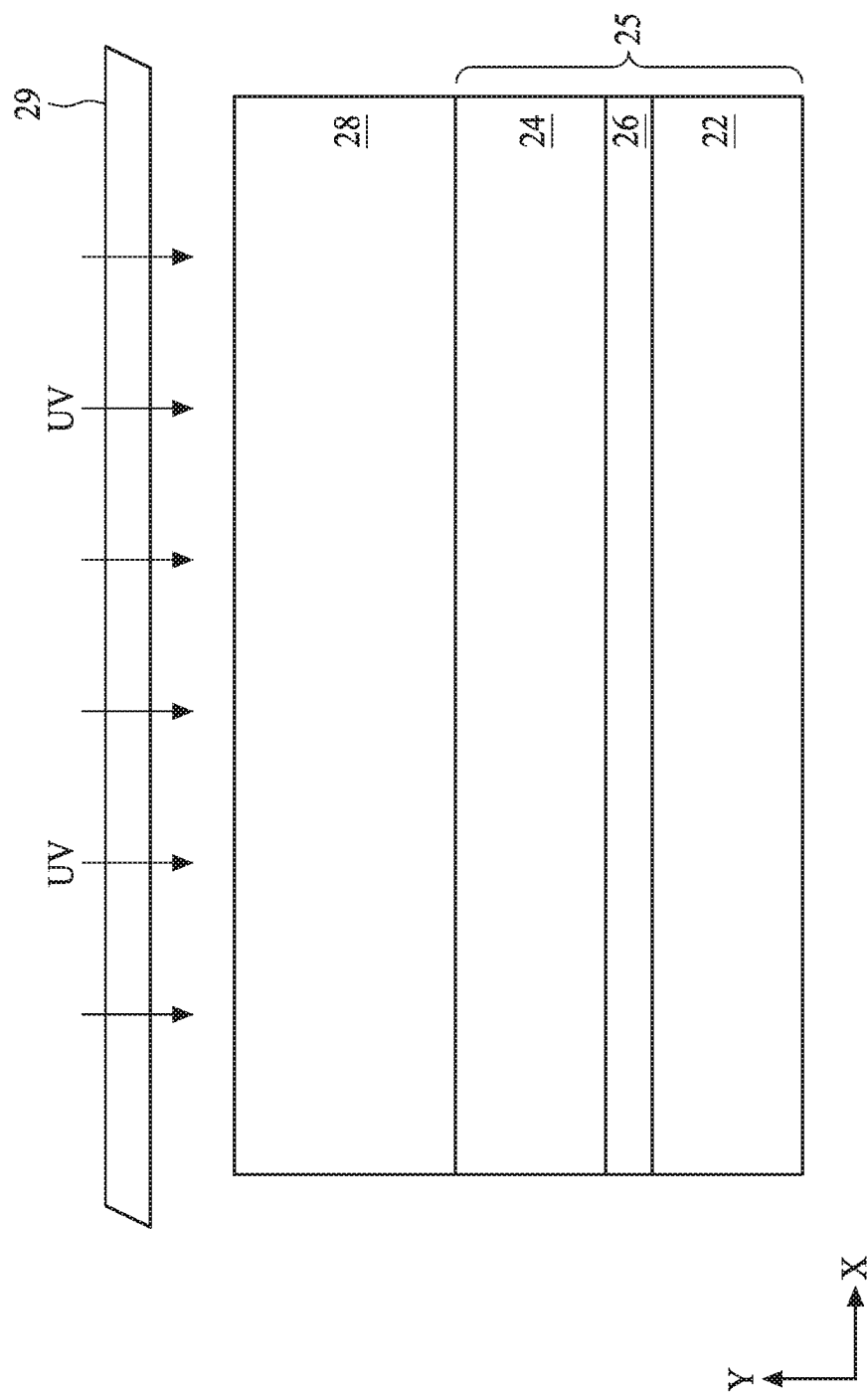

FIGS. 2A to 2J are diagrams showing a method of manufacturing the semiconductor device 1 shown in FIG. 1A, in accordance with some embodiments of the present disclosure. Referring to FIG. 2A, a semiconductor structure 25 is provided. The semiconductor structure 25 includes a first conductive layer 22, an insulating layer 26 on the first conductive layer 22, and a second conductive layer 24 on the insulating layer 26. A layer derivative from the first conductive layer 22 serves as the first electrode layer 12 of the capacitor shown in FIG. 1A. Similarly, a layer derivative from the second conductive layer 24 serves as the second electrode layer 14 of the capacitor shown in FIG. 1A. Moreover, a layer derivative from the insulating layer 26 serves as the dielectric layer 16 of the capacitor shown in FIG. 1A.

After the semiconductor structure 25 is provided, a photoresist layer 28 is formed on the second conductive layer 24 by, for example, a priming process, a coating process and a soft bake process, which are performed in order. In the present embodiment, the photoresist layer 28 includes a positive photoresist. However, the disclosure is not limited thereto. In other embodiments, the photoresist layer 28 includes a negative photoresist.

Afterwards, a photomask 29 having a pattern is provided. Light, such as ultraviolet (UV) light, radiates the photoresist layer 28 via the photomask 29. Accordingly, the pattern of the photomask 29 is transferred onto the photoresist layer 28. In the present embodiment, since the photoresist layer 28 is a positive photoresist, a portion of the photoresist layer 28 exposed to the light remains, and other portions are removed.

During the whole process for manufacturing the semiconductor device 1, only one photomask (i.e., the photomask 29 shown in FIG. 2A) is required. Specifically, the photoresist layer 28 is not removed until the whole process for manufacturing the semiconductor device 1 shown in FIG. 1A is finished. In the following process, the first conductive layer 22, the insulating layer 26 and the second conductive layer 24 are patterned without removing the photoresist layer 28. Therefore, there is no need to introduce another photoresist layer having a different pattern from the photoresist layer 28. Specifically, the first conductive layer 22, the insulating layer 26 and the second conductive layer 24 are patterned by using the photoresist layer 28 and its derivative photoresist layer as a mask, which will be described and illustrated in detail with reference to FIGS. 2C to 2J. As a result, a lot of operations for preparing a lot of masks can be omitted, and therefore the manufacturing process is simplified and cost efficient.

Figure 2B:
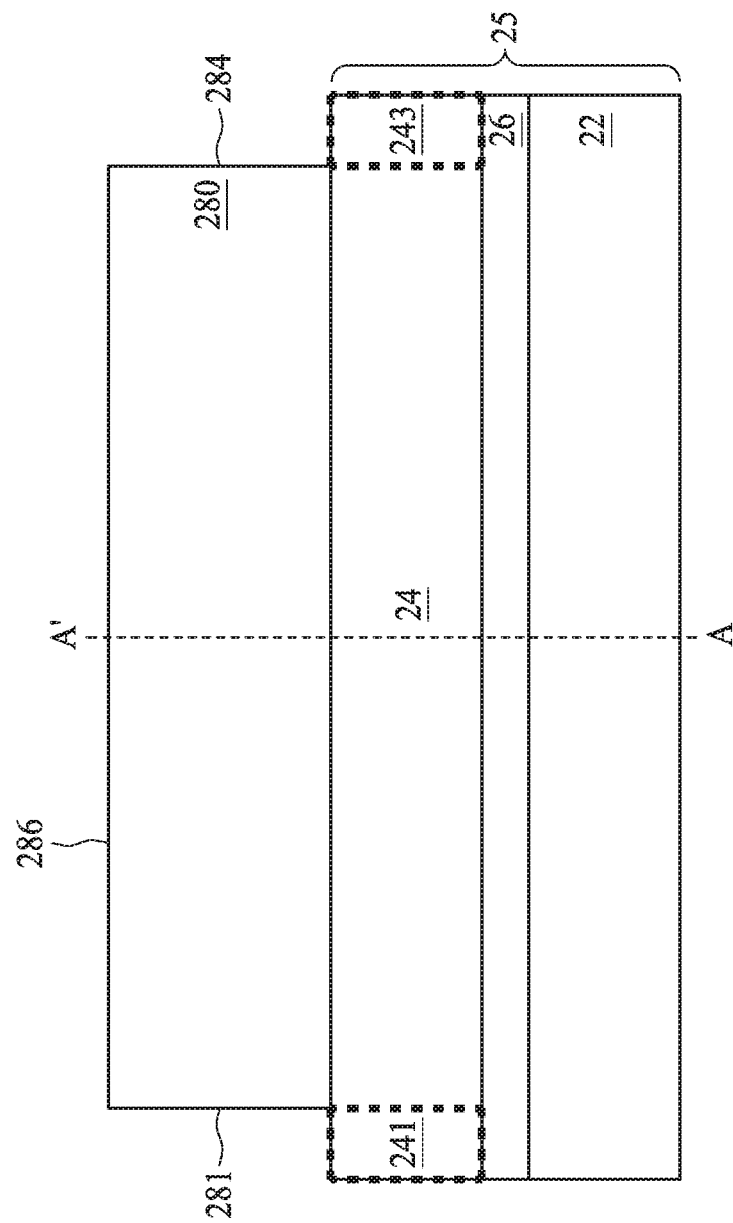

Referring to FIG. 2B, a first patterned photoresist layer 280, having a first sidewall 281, a second sidewall 284 and a surface 286, is formed on the second conductive layer 24 by, for example, a development process on the photoresist layer 28, followed by a hard bake process. The first patterned photoresist layer 280 exposes a first terminal portion 241 and a second terminal portion 243 of the second conductive layer 24. In an embodiment, the second terminal portion 243 and the first terminal portion 241 are symmetrical to each other with respect to the center line A-A'.

Figure 2C:
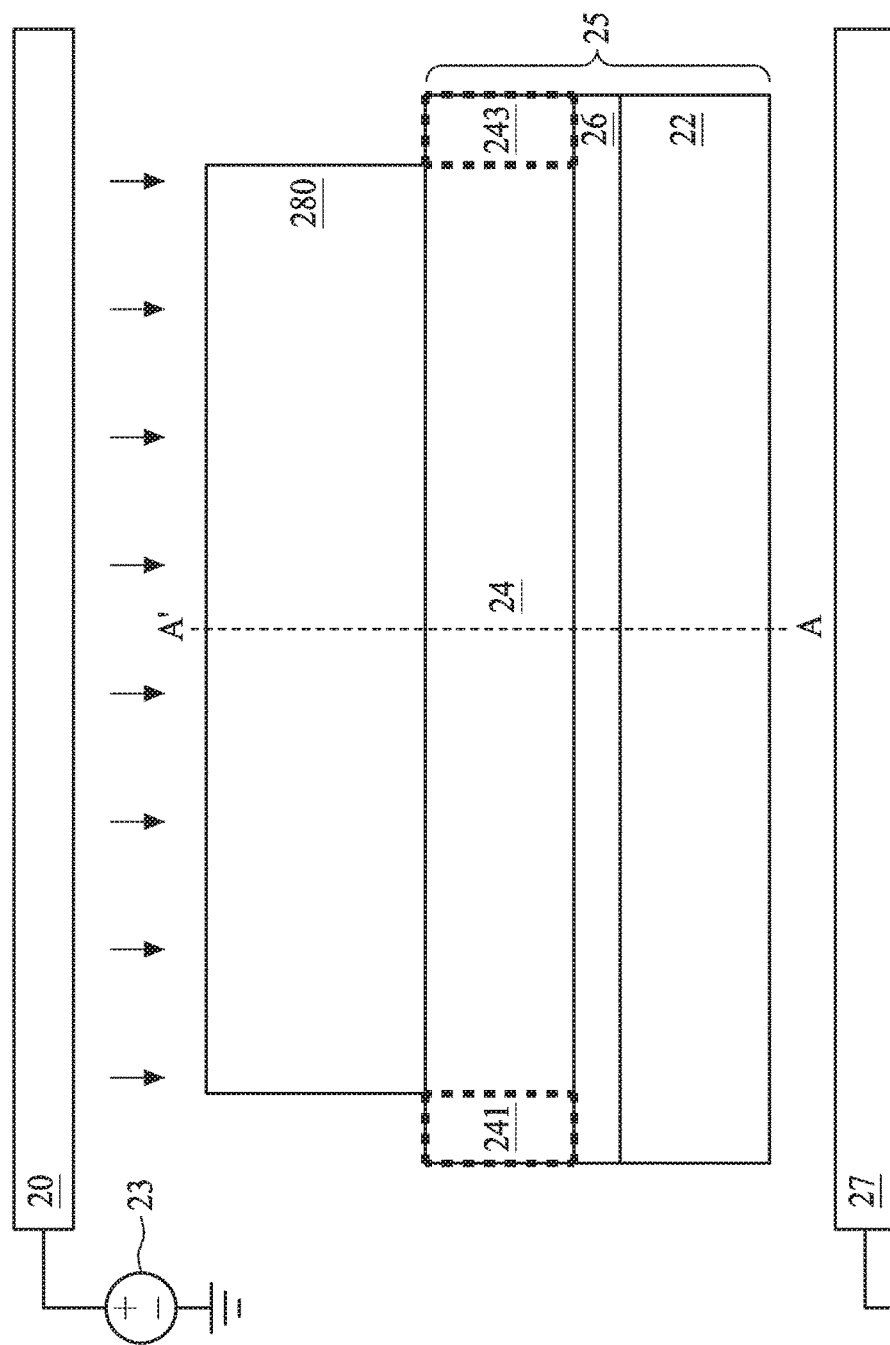

Referring to FIG. 2C, a first electrode 20 and a second electrode 27 are provided at the opposite sides of the semiconductor structure 25. The first electrode 20 is biased by a voltage source 23, and the second electrode 27 is biased by a voltage source 26. The voltage source 23 and the voltage source 26 provide a differential voltage in an etching process. For example, the voltage source 23 provides a voltage of 5 volts, and the voltage source 26 provides a voltage of 0 volts.

In the etching process, an etch chemistry (not shown), such as gas, is introduced and the voltage provided by the voltage source 23 is applied to generate plasma (i.e., the ionized gas atoms). Afterwards, with an electric field established between the first electrode 20 and the second electrode 27, the ionized gas atoms bombard the second conductive layer 24, using the first patterned photoresist layer 280 as a mask, and thereby anisotropically etching the second conductive layer 24. Moreover, etching selectivity can be well-controlled, such that the first patterned photoresist layer 280 is only etched slightly.

In an embodiment, the etch chemistry includes fluorine-containing gas (e.g., $CF_4$, $C_4F_8$, $C_5F_8$, $C_6F_8$, $SF_6$, $CH_2F_2$, $CHF_3$, and/or $C_2F_6$), chlorine-containing gas (e.g., $Cl_2$, $CHCl_3$, $CCl_4$, and/or $BCl_3$), bromine-containing gas (e.g., HBr and/or $CHBr_3$), oxygy-containing gas, iodine-containing gas, other suitable gases and/or plasmas, or combinations thereof. In another embodiment, the etch chemistry includes $Cl_2$, $BCl_3$, Ar, Fluorine-based chemistry, HF-based chemistry, $NH_4OH$, the combination of $NH_4OH$ and $H_2O_2$, the combination of HCl and $H_2O_2$, the combination of $H_2SO_4$ and $H_2O_2$, or other suitable materials. The etching process may include a multiple-step etching to gain etch selectivity, flexibility and desired etch profile.

Figure 2D:
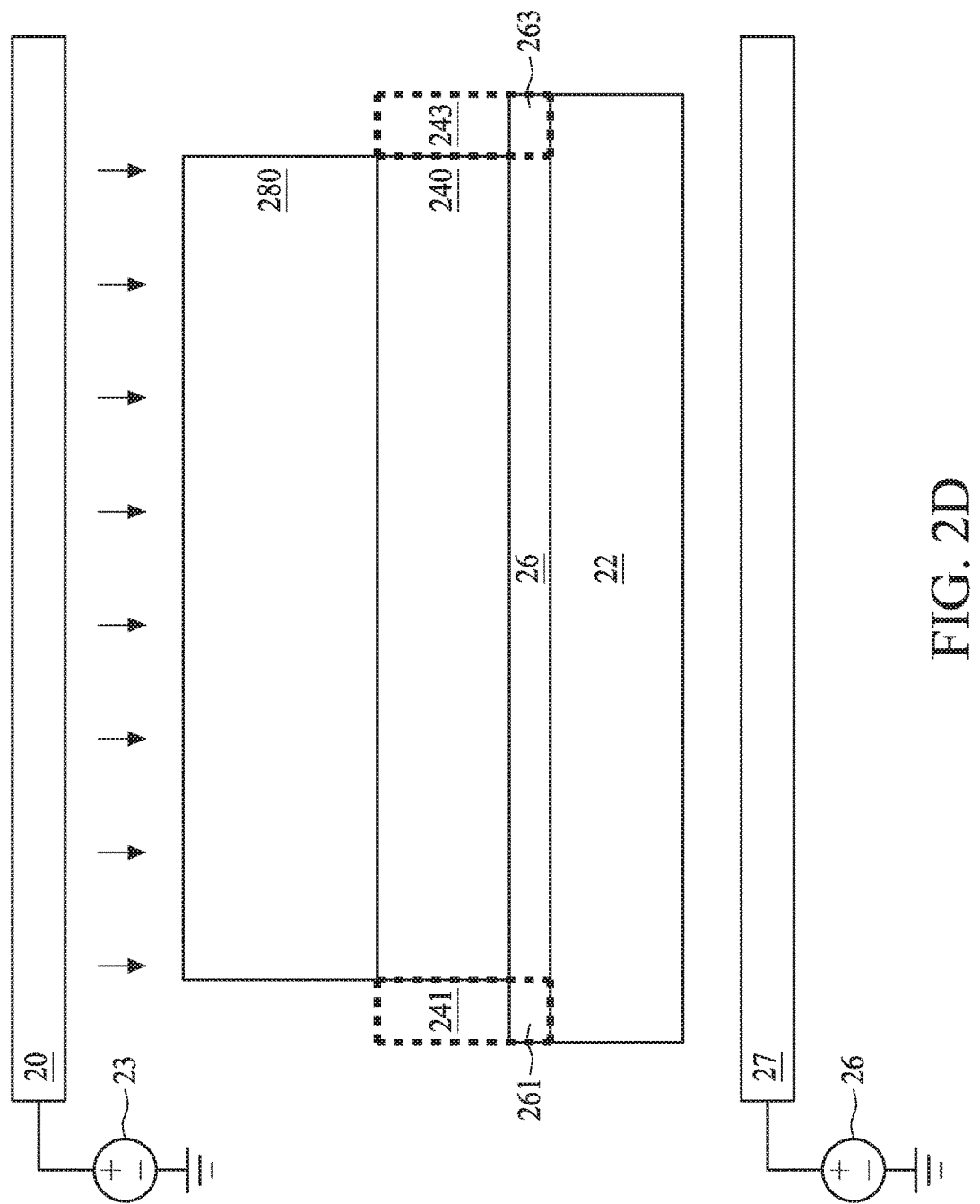

Referring to FIG. 2D, a first patterned second conductive layer 240 is formed by, for example, a plasma etching process as discussed in the illustrative embodiment of FIG.

2C, removing the first and second terminal portions 241 and 243 of the second conductive layer 24. As a result, terminal portions 261 and 263 of the insulating layer 26 that were covered by the first and second terminal portions 241 and 243 of the second conductive layer 24 are exposed.

Figure 2E:
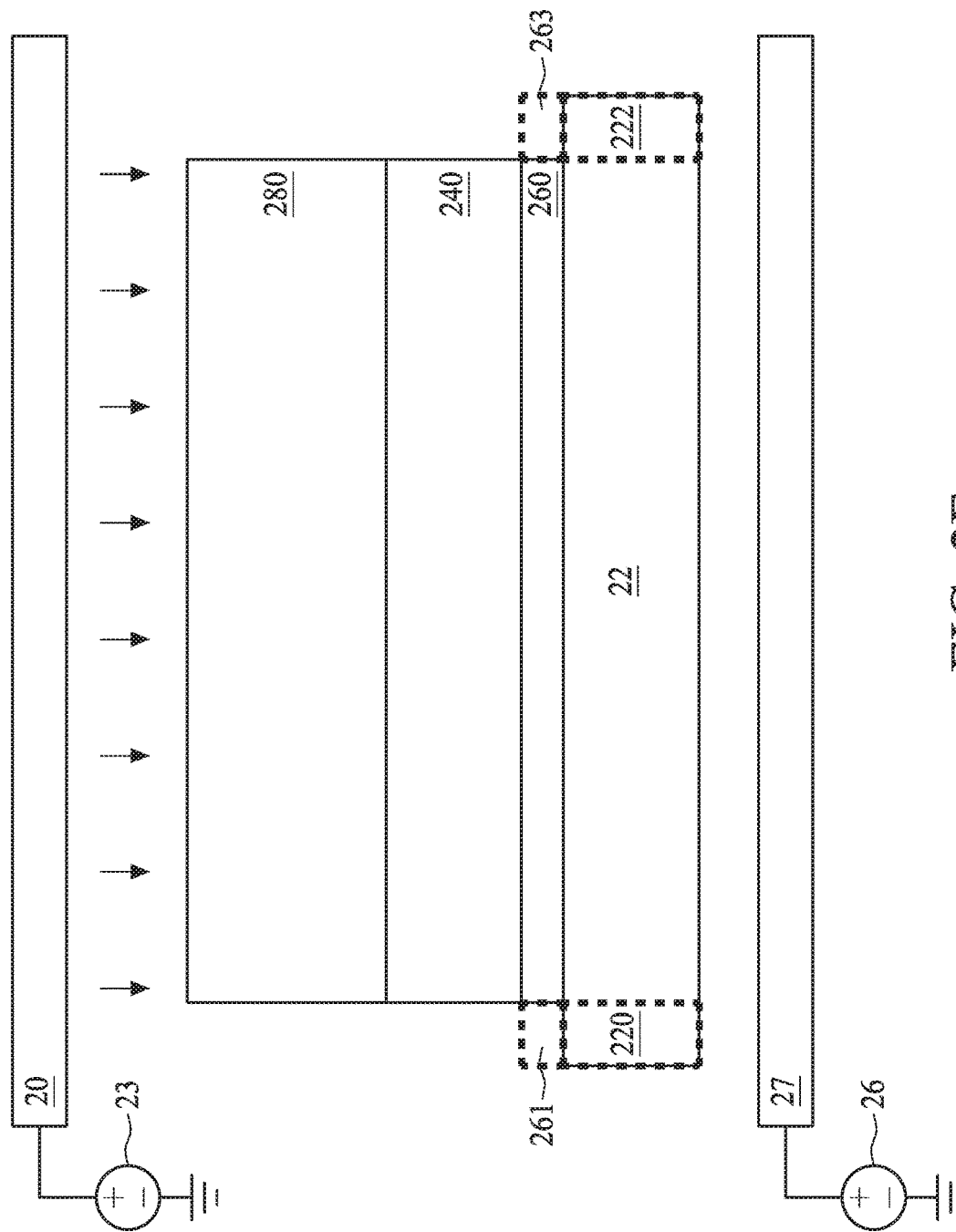

Referring to FIG. 2E, a first patterned insulating layer 260 is formed by, for example, a plasma etching process as discussed in the illustrative embodiment of FIGS. 2C and 2D, using the first patterned photoresist layer 280 as a mask. The plasma etching process removes exposed portions 261 and 263 of the insulating layer 26.

Selectivity of the plasma etching process can be well controlled, such that the first patterned photoresist layer 280 is only slightly etched when the insulating layer 26 is etched. Moreover, a detection approach can be applied, such that the etching process stops until portions 220 and 222 of the first conductive layer 22 under the portions 261 and 263 of the insulating layer 26 are exposed.

Figure 2F:
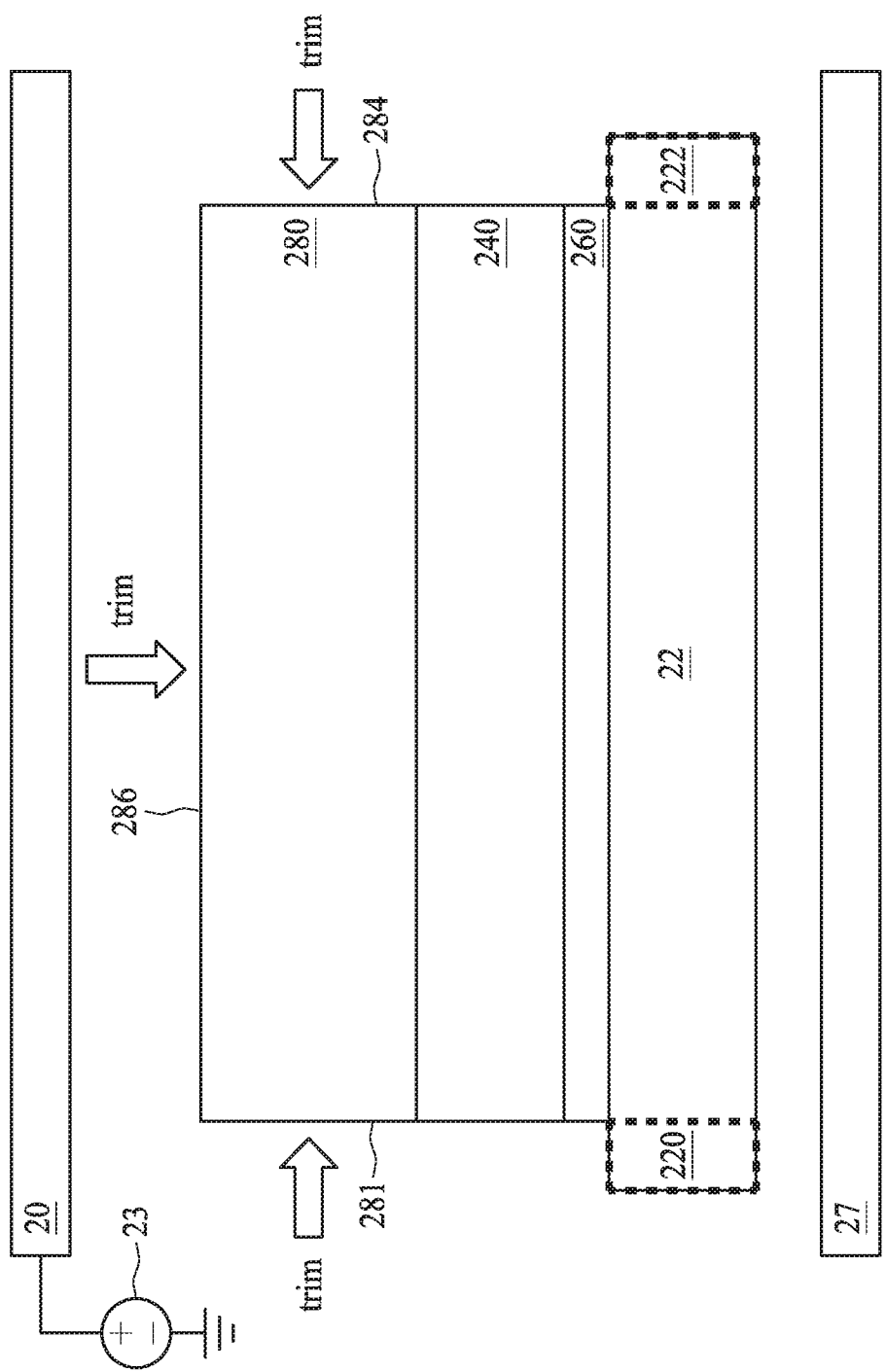

Referring to FIG. 2F, the second electrode 27 is not biased, and only the first electrode 20 facing the first patterned photoresist layer 280 is still biased. An etch chemistry (not shown), such as gas, is introduced and ionized by an electromagnetic (EM) field established by the biased first electrode 20. The ionized gas atoms trim the surface 286, the first sidewall 281 and the second sidewall 284 of the first patterned photoresist layer 280 by, for example, an etching process. In an embodiment, the first patterned photoresist layer 280 is etched isotropically. In an embodiment, the plasma is inductive coupled plasma (ICP).

Unlike the stage shown in the illustrative embodiment of FIG. 2C, in the present stage, because the second electrode 27 is not biased, an ion bombardment would generally not occur.

Referring to FIG. 2G, a second patterned photoresist layer 282 is formed on the first patterned second conductive layer 240 by, for example, an etching process as discussed in the illustrative embodiment of FIG. 2F. The first sidewall 281, the second sidewall 284 and the surface 286 of the first patterned photoresist layer 280 after the trimming process are reduced by substantially a length D1.

A terminal portion 245 and a terminal portion 247 of the first patterned second conductive layer 240 are exposed by the second patterned photoresist layer 282.

Figure 2H:
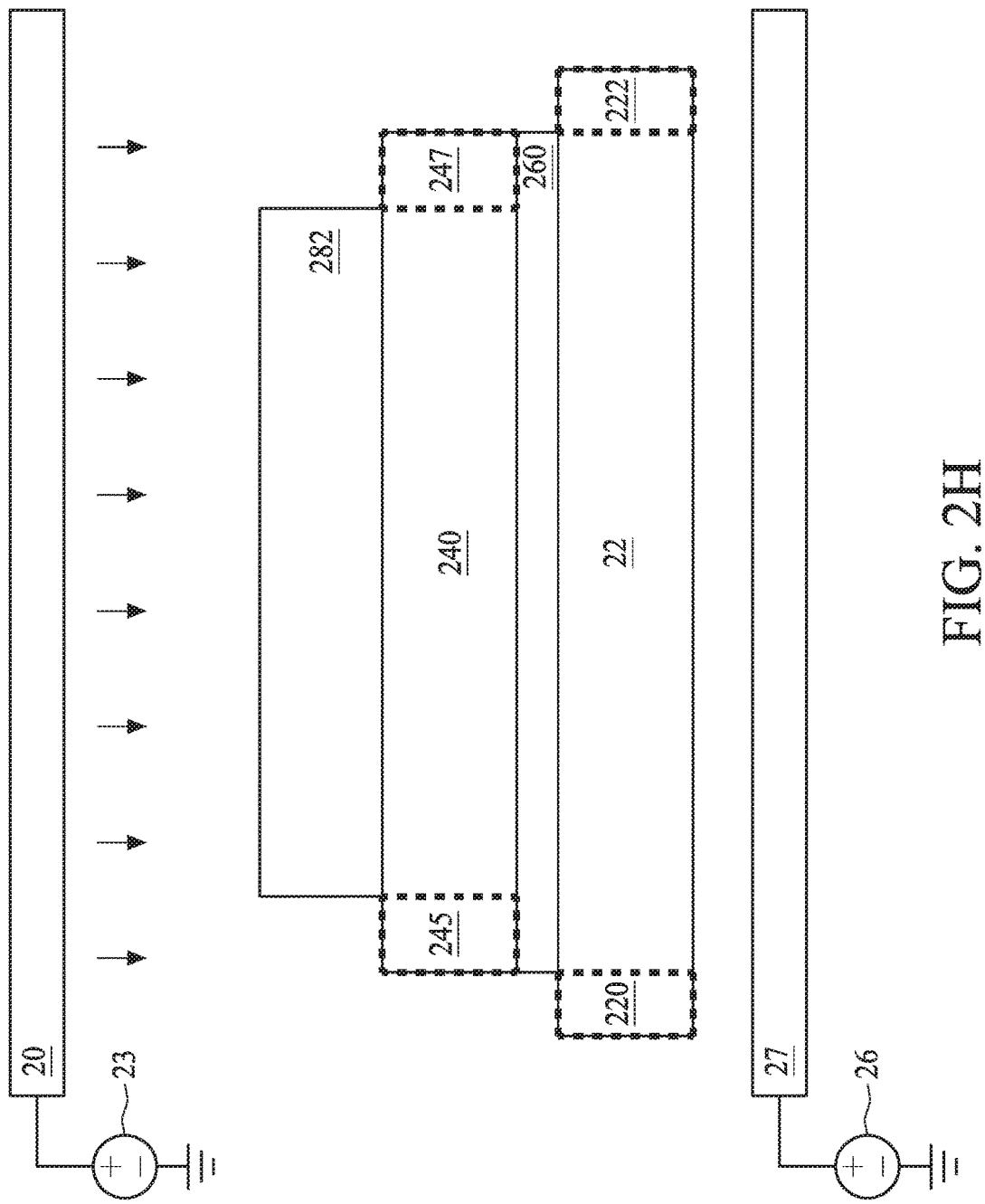

Referring to FIG. 2H, the present stage is similar to the stage described and illustrated with reference to FIG. 2C. An etch chemistry (not shown), such as gas, is introduced and the voltage provided by the voltage source 23 is applied to generate plasma (i.e., the ionized gas atoms). Afterwards, with an electric field established between the first electrode 20 and the second electrode 27, the ionized gas atoms bombard the first patterned second conductive layer 240 and the first conductive layer 22, using the second patterned photoresist layer 282 as a mask. Specifically, the ionized gas atoms bombard the terminal portions 245 and 247 of the first patterned second conductive layer 240 and the terminal portions 220 and 222 of the first conductive layer 22. Because the terminal portions 245 and 247 of the first patterned second conductive layer 240 are not masked by any photoresist layer, the etching process performed on the terminal portions 245 and 247 is called "a blanket etching process."

In the present disclosure, the second patterned photoresist layer 282, which is derivative from the photoresist layer 28, is used as a mask for patterning the first patterned second conductive layer 240. The method of the present disclosure does not require any other photoresist layer. Therefore, the manufacturing process is simplified.

Figure 2I:
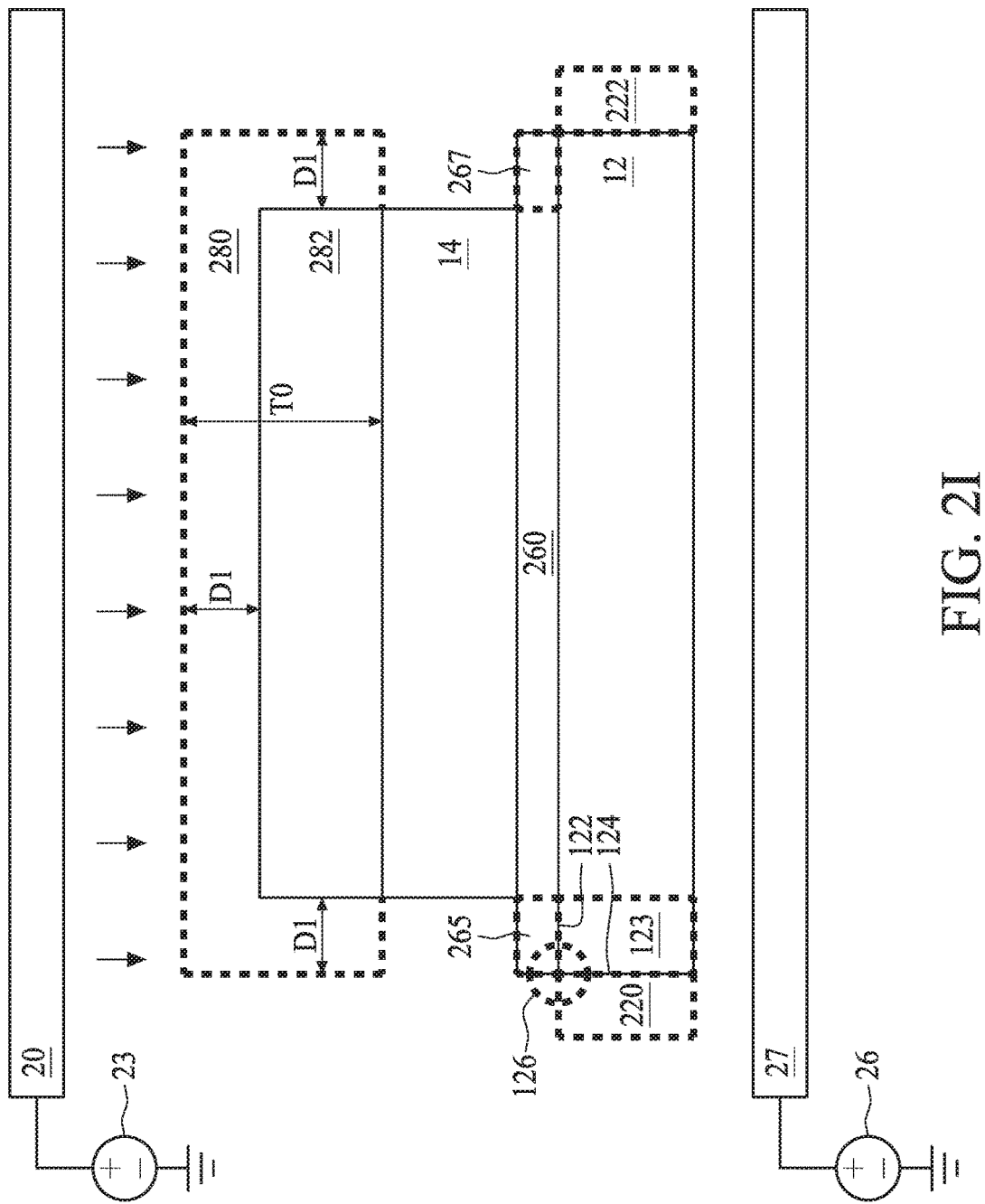

Referring to FIG. 2I, the present stage is similar to the stage described and illustrated with reference to FIG. 2E. A second patterned second conductive layer 14 is formed by, for example, an etching process on the first patterned second conductive layer 240, exposing terminal portions 265 and 267 of the first patterned insulating layer 260. The second patterned second conductive layer 14 serves as the second electrode layer 14 shown in FIG. 1A.

Similar to the description in the illustrative embodiment of FIG. 2H, in the present disclosure, the second patterned photoresist layer 282, which is derivative from the photoresist layer 28, is used as a mask for patterning the first patterned insulating layer 260. The method of the present disclosure does not require any other photoresist layer. Therefore, the manufacturing process is simplified and cost efficient.

Figure 2J:
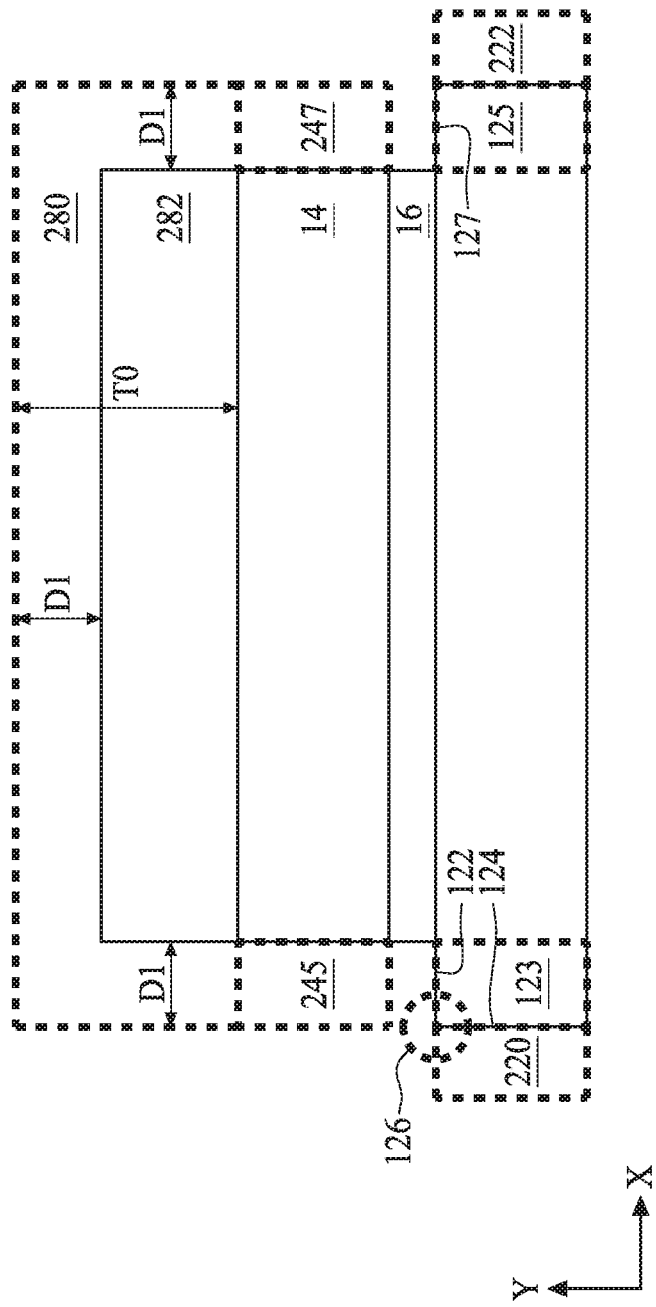

Referring to FIG. 2J, a second patterned insulating layer 16 is formed on the first patterned first conductive layer 12 by, for example, an etching process on the first patterned insulating layer 260, exposing terminal portions 123 and 125 of the first patterned first conductive layer 12. In some embodiments, the first patterned insulating layer 260 is etched anisotropically.

During the etch of the first patterned insulating layer 260, a corner 126 and a surface 122 of the terminal portion 123 are also etched. Before the corner 126 is etched, the profile of the corner 126 is, for example, a right angle, while the surface 122 is a substantially planar surface. That is, the corner 126 and the surface 122 have different profiles. The profiles relates to the etching rate, which will be described in detail with reference to FIGS. 3A to 3C. The corner 126 is etched at a higher etching rate than the surface 122. As a result, the corner 126 has a rounded shape.

In the embodiments, the terminal portions 245 and 247 of the first patterned second conductive layer 240 and the terminal portions 265 and 267 of the second patterned insulating layer 260 are not masked. As a result, the corner 126 of the terminal portion 123 of the first patterned first conductive layer 12 has a rounded shape. The corner 126 having a rounded shape reflects that a semiconductor device is manufactured according to the method of the present disclosure.

In some existing manufacturing processes, to form a ladder shape, no trimming process as mentioned in the illustrative embodiment of FIGS. 2F and 2J are taken. Rather, a patterned photoresist layer (such as the first patterned photoresist layer 280) is removed. Afterwards, another patterned photoresist layer is formed on the first conductive layer 22 and the first patterned second conductive layer 240. The other patterned photoresist layer fully encapsulates the first patterned second conductive layer 240 and the first patterned insulating layer 260. Accordingly, a terminal portion of the first conductive layer 22 is exposed. Since the first patterned second conductive layer 240 and the first patterned insulating layer 260 are encapsulated, a blanket etching does not occur. As a result, a corner (for example, the corner 126) does not have a rounded shape after the etching process.

Moreover, referring back to FIG. 2A, in the present embodiment, the photomask 29 is aligned to the center line A-A' of the first conductive layer 22. As a result, referring to FIG. 2B, the first patterned photoresist layer 280 is symmetric with respect to the center line A-A' of the first conductive layer 22 in structure. Accordingly, the first terminal portion 241 is the same as the second terminal portion 243 in length. Since, referring to FIG. 2D, the first and second terminal portions 241 and 243 have the same in size and, referring to FIG. 2F, the patterned photoresist layer 282 is trimmed for the same length at the first and second sidewalls 280 and 282, the terminal portions 245 and 247 are the same in size, resulting in that, referring to FIG. 2H, the terminal portions 220 and 222 are the same in size. As a result, the semiconductor device 1 is symmetric in structure.

In another embodiment, referring to FIG. 2A, the photomask 29 is not aligned to the center line A-A' of the first conductive layer 22. The photomask 29 is freely arranged over the semiconductor structure 25. Referring to FIG. 2B, the terminal portions 241 and 243 are not the same in size, resulting in that referring to FIG. 2D the terminal portions 220 and 222 are not the same in size. However, Referring to FIG. 2G, the terminal portions 220 and 222, which are not the same in size, are removed. As a result, the semiconductor device 1 is still symmetric. That is, if a semiconductor device is manufactured according to the method of the present disclosure, no matter the photomask 29 is aligned to the center line of a bottom layer (such as the first conductive layer 22), the semiconductor device can still have a symmetric structure. As a result, the manufacturing process is not confined to be performed with the relatively high accuracy on the aligning process. The manufacturing process is simplified.

Additionally, referring to FIG. 2H, for convenience of illustration, the first conductive layer 22 is a little longer than the first patterned second conductive layer 240. In fact, the first conductive layer 22 is a virgin material, which means that the first conductive layer 22 has not patterned yet. Therefore, the first conductive layer 22 is quite longer than the first patterned second conductive layer 240. In that case, the profile formed by the first conductive layer 22 and the first patterned second conductive layer 240 cannot be regarded as a ladder shape. To form a ladder shape, the first conductive layer 22 needs to be patterned.

In some existing manufacturing processes, in order to form a ladder structure, as mentioned above, another patterned photoresist layer is planned to be formed on the first conductive layer 22, and encapsulates the patterned second conductive layer 240. In order to make the semiconductor device symmetric, a photomask must be perfectly aligned to the center of the first conductive layer 22. However, in practice, it is difficult to precisely align the photomask to the center of the first conductive layer 22. If the photomask is not enough precisely aligned to the center of the first conductive layer 22, a first portion and a second portion of the first conductive layer 22 masked by the other patterned photoresist layer are different in size. Afterwards, in the etching process, two terminal portions of the first conductive layer 22 exposed by the other patterned photoresist layer are removed, and the other patterned photoresist layer is subsequently stripped. A semiconductor device defined by the patterned first electrode layer and the patterned second electrode layer has two ladders at opposite sides. A surface of the first portion serves as a surface of one ladder, and a surface of the second portion serves as a surface of another ladder. As mentioned above, the surfaces of the first and second portion are not symmetrical, resulting in two ladders of different sizes. That is, such semiconductor device is not symmetric with respect to the patterned first electrode layer.

Figure 3A:
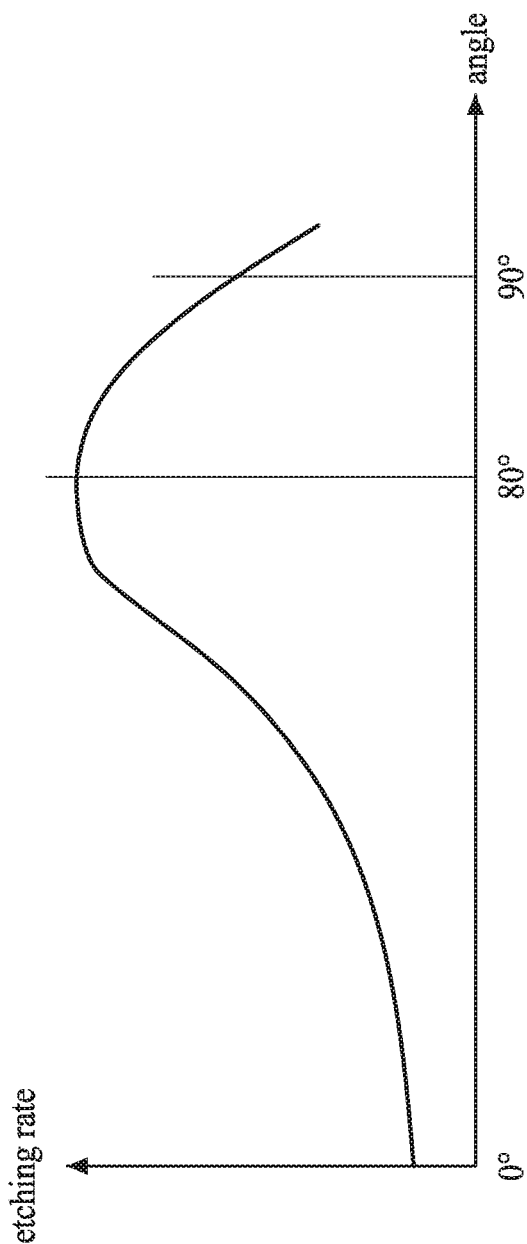
FIGS. 3A to 3C are diagrams for explaining relationship between etching rate and etch angle, in accordance with some embodiments of the present disclosure.
Figure 3B:
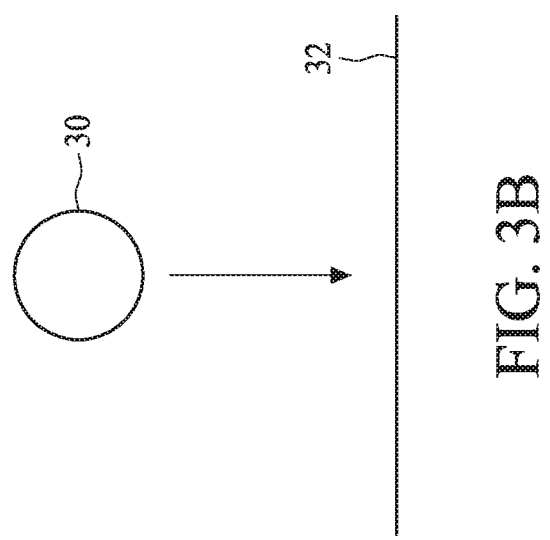
Figure 3C:
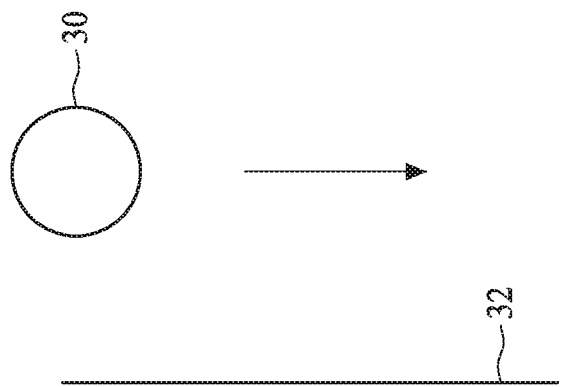

FIGS. 3A to 3C are diagrams for explaining relationship between etching rate and etch angle, in accordance with some embodiments of the present disclosure. Referring to FIG. 3A, the horizontal axis represents an etch angle ranging from approximately 0 degree to approximately 90 degree. The etch angle refers to an angle between a direction in which an object such as an ionized particle moves and a normal direction of a surface upon which the object impinges. The vertical axis represents the etching rate. FIG. 3A shows that the etching rate is relatively fast at the angle of 80 degrees, and is relatively slow at the angle of 0 degree. The etching rate is different as the etch angle is different. The above values in degree are only for exemplary, and the present disclosure is not limited thereto.

Referring to FIG. 3B, an object 30 moves in a direction substantially parallel to the normal direction of a surface 32. As a result, the angle is approximately 0 degree. Contrarily, referring to FIG. 3C, the object 30 moves in a direction substantially orthogonal to the normal direction of the surface 32. As a result, the angle is approximately 90 degrees. Referring back to FIG. 2J, the corner 126 after etch has a rounded shape due to a higher etching rate than the surface 122.

FIG. 4 is a cross-sectional view of a semiconductor device 4, in accordance with some embodiments of the present disclosure. Referring to FIG. 4, the semiconductor device 4 includes a deep trench capacitor (DTC) defined by a first dielectric layer 40, a first electrode layer 42, a second dielectric layer 44 and a second electrode layer 46. The first electrode layer 42 and the second electrode layer 46 are coupled to an interconnect feature 418 in, for example, a metal-1 layer, via an interconnect feature 414 and an interconnect feature 416, respectively. A portion of the DTC is formed in a well 412 in a substrate 410.

The DTC is symmetric in structure with respect to a center line B-B' of any one of the first dielectric layer 40, the first electrode layer 42, the second dielectric layer 44 and the second electrode layer 46. Specifically, a terminal portion 421 and a terminal portion 424 of the first electrode layer 42 are exposed by the second electrode layer 46. The terminal portion 421 and the terminal portion 424 are the same in structure (or in size).

The terminal portion 421 has a sidewall 420, a surface 423 and a corner 422 connecting the sidewall 420 with the surface 423. The surface 423 of the terminal portion 421 serves as a land to allow the interconnect feature 414, such as contact, to place thereon. To allow and facilitate the placement, the surface 423 is required to be larger in length than the surface of the interconnect feature 414. In some embodiments, the surface 423 of the terminal portion 421 ranges from approximately 10 angstroms to approximately 10,000 angstroms. Moreover, the corner 422 has a rounded shape. The surface 423 of the terminal portion 421 and a surface (not labeled) of the terminal portion 424 has the substantially same length D3.

The symmetric structure of the DTC and the corner 422 having a rounded shape reflect that the DTC is manufactured by the process described and illustrated with reference to FIGS. 2A to 2J. That manufacturing process is simplified and cost efficient.

Figure 5:
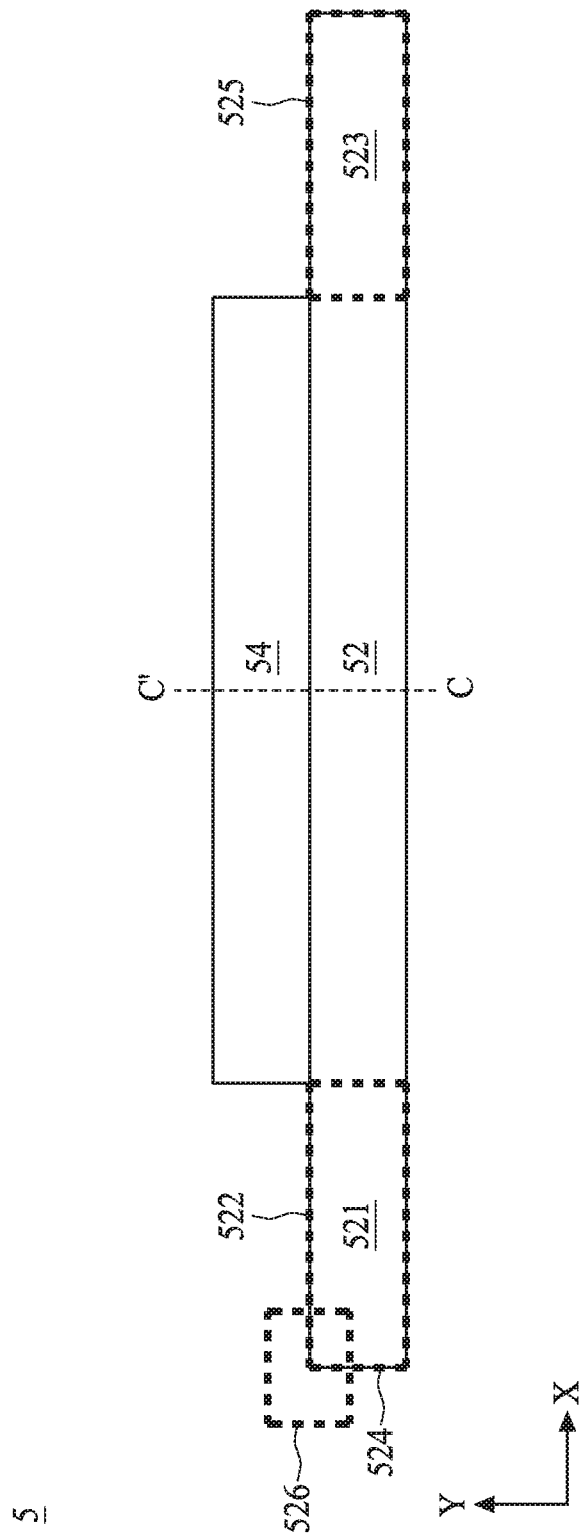
FIG. 5 is a cross-sectional view of a semiconductor device, in accordance with some embodiments of the present disclosure.

FIG. 5 is a cross-sectional view of a semiconductor device 5, in accordance with some embodiments of the present disclosure. Referring to FIG. 5, the semiconductor device 5 is similar to the semiconductor device 1 described and illustrated with reference to FIG. 1A except that, the semiconductor device 5 includes a first layer 52 of a first material and a second layer 54 of a second material different from the first material.

The second layer 54 is disposed on the first layer 52, and extends in a first direction X for a different length from the first layer 52. The second layer 54 exposes a terminal portion 521 and a terminal portion 523 of the first layer 52. The second layer 54 is symmetric with respect to a center line C-C' of the first layer 52. As a result, the terminal portion 521 and the terminal portion 523 are substantially the same in structure. That is, a surface 522 of the terminal portion 521 and a surface 525 of the terminal portion are substantially the same in size.

Moreover, the terminal portion 521 has a surface 522, a sidewall 524 and a corner 526 connecting the surface 522 with the sidewall 524. The corner 526 has a rounded shape. Furthermore, the terminal portion 525 also has a corner (not labeled) having a rounded shape.

The symmetric structure of the semiconductor device 5 and the corner 526 having a rounded shape can evidence that the semiconductor device 6 is manufactured by the process described and illustrated with reference to FIGS. 2A to 2J.

Figure 6:
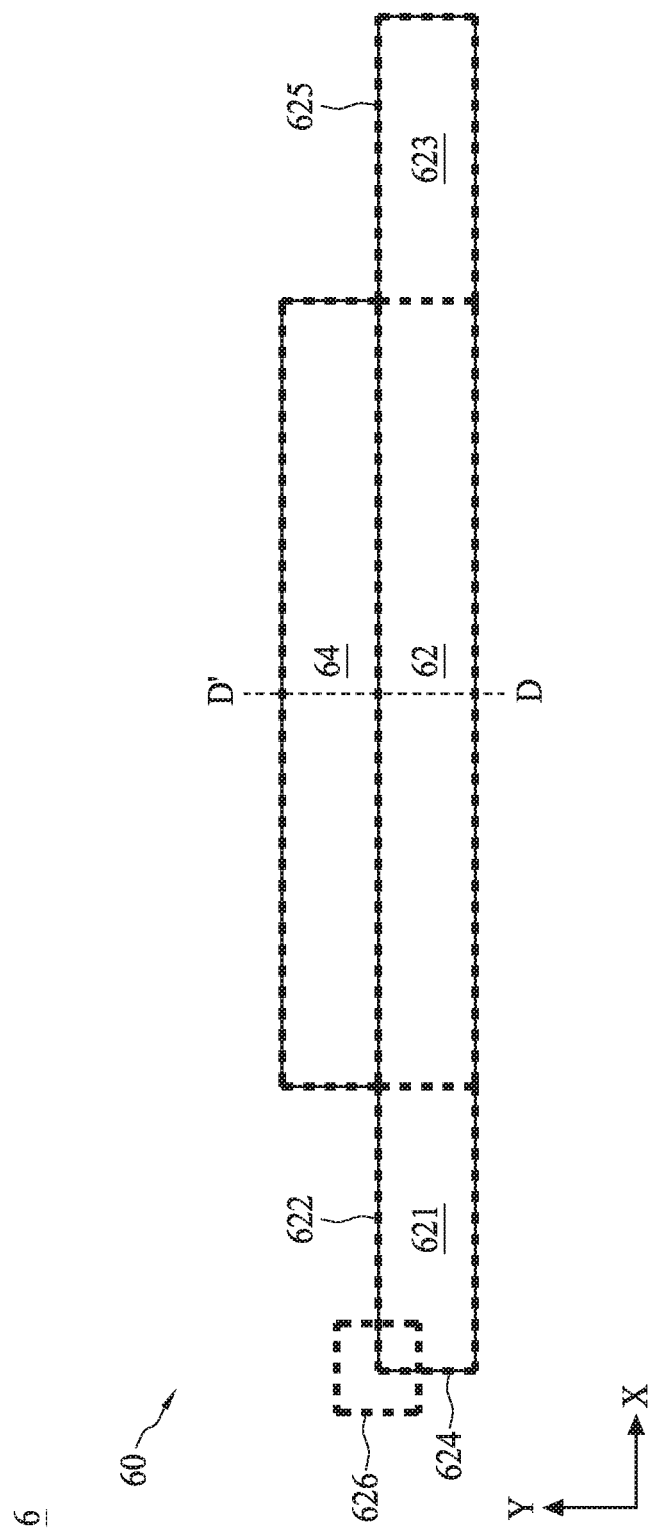
FIG. 6 is a cross-sectional view of a semiconductor structure of a semiconductor device, in accordance with some embodiments of the present disclosure.

FIG. 6 is a cross-sectional view of a semiconductor structure 60 of a semiconductor device 6, in accordance with some embodiments of the present disclosure. Referring to FIG. 6, the semiconductor device 6 is similar to the semiconductor device 5 described and illustrated with reference to FIG. 5 except that, the semiconductor structure 60 is a bulk including a first portion 62 and a second portion 64.

The first portion 62 extends in a first direction X. The second portion 64 protrudes, in a second direction Y, from a center portion of the first portion 62. The second portion 64 exposes a terminal portion 621 and a terminal portion 623 of the first portion 64. Additionally, the second portion 64 is symmetric with respect to a center line D-D' of the first portion 62 in the second direction Y. As a result, the terminal portion 621 and the terminal portion 623 are substantially the same in structure. That is, a surface 622 of the terminal portion 621 and a surface 625 of the terminal portion 623 are substantially the same in size.

Moreover, the terminal portion 621 has a surface 622, a sidewall 624 and a corner 626 connecting the surface 622 with the sidewall 624. The corner 626 has a rounded shape. Furthermore, the terminal portion 623 also has a corner (not labeled) having a rounded shape.

The symmetric structure of the semiconductor structure 60 and the corner 626 having a rounded shape can evidence that the semiconductor structure 60 is manufactured by the process described and illustrated with reference to FIGS. 2A to 2J.

Some embodiments have one or a combination of the following features and/or advantages. In some embodiments, a semiconductor device includes a first electrode layer and a second electrode layer. The first electrode layer extends in a first direction. The second electrode layer extends in the first direction for a different length from the first electrode layer, and is symmetric with respect to a center line of the first electrode layer in a second direction. The second electrode layer defines a capacitor with the first electrode layer.

In some embodiments, a semiconductor device includes a structure a first portion and a second portion. The first portion extends in a first direction. The second portion protrudes, in a second direction, from a center portion of the first portion, and is symmetric with respect to a center line of the first portion in the second direction.

In some embodiments, a semiconductor device includes a first dielectric layer, a first electrode layer, a second dielectric layer and a second electrode layer. The second electrode layer in combination with the first dielectric layer, the first electrode layer and the second dielectric layer defines a deep trench capacitor (DTC), wherein the DTC is symmetric in structure with respect to a center line of any one of the first dielectric layer, the first electrode layer, the second dielectric layer and the second electrode layer.

The foregoing outlines features of several embodiments so that those skilled in the art may better understand the aspects of the present disclosure. Those skilled in the art should appreciate that they may readily use the present disclosure as a basis for designing or modifying other operations and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a first electrode layer extending in a first direction; and
   a second electrode layer, extending in the first direction for a different length from the first electrode layer, defining a capacitor with the first electrode layer, and being symmetric with respect to a center line of the first electrode layer in a second direction,
   wherein the second electrode layer exposes a terminal portion of the first electrode layer, the terminal portion including:
   a sidewall;
   a surface; and
   a corner connecting the sidewall with the surface, wherein the corner has a rounded shape.

2. The semiconductor device of claim 1, further comprising:
   a dielectric layer between the first and second electrode layers, and extending in the first direction for the same length as the second electrode layer.

3. The semiconductor device of claim 1, wherein the second electrode layer extends for a length shorter than a length for which the first electrode layer extends.

4. The semiconductor device of claim 1, wherein the second electrode layer partially covers the first electrode layer.

5. The semiconductor device of claim 4, wherein length of the surface ranges from 10 angstroms to 10,000 angstroms.

6. The semiconductor device of claim 1, further comprising:
   a well in which a portion of the first electrode layer and a portion of the second electrode layer are formed; and
   a substrate in which the well is defined.

7. The semiconductor device of claim 6, wherein the second electrode layer exposes a terminal portion of the first electrode layer, and the terminal portion is disposed on the substrate.

8. The semiconductor device of claim 7, wherein the first electrode layer includes a first material, and the second electrode layer includes a second material different from the first material.

9. A semiconductor device, comprising:
   a structure including:
   a first portion extending in a first direction; and
   a second portion protruding, in a second direction, from a center portion of the first portion, and being symmetric with respect to a center line of the first portion in the second direction,
   wherein the second portion exposes a terminal portion of the first portion, the terminal portion including:
   a surface;
   a sidewall; and
   a corner connecting the surface to the sidewall, wherein the corner has a rounded shape.

10. The semiconductor device of claim 9, wherein material of the structure includes one of poly, dielectric and metal.

11. The semiconductor device of claim 9, wherein length of the surface ranges from 10 angstroms to 10,000 angstroms.

12. A semiconductor device, comprising:
a first dielectric layer;
a first electrode layer;
a second dielectric layer; and
a second electrode layer in combination with the first dielectric layer, the first electrode layer and the second dielectric layer defining a deep trench capacitor (DTC), wherein the DTC is symmetric in structure with respect to a center line of any one of the first dielectric layer, the first electrode layer, the second dielectric layer, and the second electrode layer,
wherein the first terminal portion has a sidewall, a surface and a corner connecting the sidewall with the surface, the corner having a rounded shape.

13. The semiconductor device of claim 12, wherein the second electrode layer exposes a first terminal portion and a second terminal portion of the first electrode layer, the first terminal portion and the second terminal portion being the same in size.

14. The semiconductor device of claim 13, wherein the first terminal portion serves as a land to allow a contact to place thereon, and the second terminal portion serves as a land to allow another contact to place thereon.

15. The semiconductor device of claim 14, wherein the surface of the first terminal portion is larger in length than a surface of the contact placed on the first terminal portion.

16. The semiconductor device of claim 13, wherein a surface of the first terminal portion and a surface of the second terminal portion has the same length.

17. The semiconductor device of claim 12, wherein length of the surface ranges from 10 angstroms to 10,000 angstroms.

18. The semiconductor device of claim 12, wherein a portion of the DTC is formed in a well in a substrate.

19. The semiconductor device of claim 12, wherein the first electrode layer and the second electrode layer are coupled to an interconnect feature.

20. The semiconductor device of claim 19, wherein the first electrode layer is coupled to an interconnect feature via a first interconnect feature placed on a first terminal portion and a second interconnect feature placed on a second terminal portion, wherein the second electrode layer exposes the first terminal portion and the second terminal portion of the first electrode layer.

* * * * *